(12) United States Patent
Fox

(10) Patent No.: US 6,668,302 B1
(45) Date of Patent: *Dec. 23, 2003

(54) METHOD AND ARCHITECTURE FOR RE-PROGRAMMING CONVENTIONALLY NON-REPROGRAMMABLE TECHNOLOGY

(75) Inventor: J. Ken Fox, Bothell, WA (US)

(73) Assignee: Cypress Semiconductor Corp., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/465,067

(22) Filed: Dec. 16, 1999

Related U.S. Application Data

(63) Continuation of application No. 08/730,824, filed on Oct. 17, 1996, now Pat. No. 6,006,305.

(51) Int. Cl.[7] .............................................. G06F 12/00
(52) U.S. Cl. ...................... 711/103; 711/1; 365/189.05; 365/120
(58) Field of Search .......................... 711/1, 102, 103; 365/120, 189.05, 222

(56) References Cited

U.S. PATENT DOCUMENTS

| 4,970,418 A | 11/1990 | Masterson ................... 327/31 |
| 5,264,689 A | 11/1993 | Maes et al. .................. 235/492 |
| 5,418,960 A | 5/1995 | Munroe ....................... 395/651 |
| 5,684,434 A | 11/1997 | Mann et al. ................... 331/16 |
| 5,740,112 A | 4/1998 | Tanaka et al. ......... 365/189.01 |

OTHER PUBLICATIONS

Kornacki, W.E. "The Partial Reprogramming of EPROMs", Electronic Engineering, vol. 57, No. 698, p. 43, Feb. 1985.

Cypress—Understanding the CY2291 and CY2292 7–22 to 7–29.

*Primary Examiner*—Tuan V. Thai
(74) *Attorney, Agent, or Firm*—Christopher P. Maiorana, P.C.

(57) ABSTRACT

The present invention provides a method and architecture for allowing a device using a traditional one-time programmable technology to be programmed multiple times within the package. The present invention provides multiple programming without introducing the additional complexity of external pins or specialized packaging. An address counter and main array is provided using one-time programmable technology. The address counter selects a page in the main array to write the programmable information. The desired programming information is programmed into a first page while the additional pages remain unprogrammed. When additional information needs to be configured, the address counter is incremented and points to a new page in the main array where the new programming information may be stored. As a result, a number of programming configurations can be programmed into a one-time programmable technology. The advantages of erasable technology may be implemented using the simplicity of one-time programmable technology.

18 Claims, 2 Drawing Sheets

METHOD AND ARCHITECTURE FOR RE-PROGRAMMING CONVENTIONALLY NON-REPROGRAMMABLE TECHNOLOGY

This is a continuation of U.S. Ser. No. 08/730,824, filed Oct. 17, 1996, now U.S. Pat. No. 6,006,305.

FIELD OF THE INVENTION

The present invention relates to programmable technology generally, and more particularly, to a method and architecture for reprogramming conventionally non-reprogrammable technology.

BACKGROUND OF THE INVENTION

It is desirable to provide external programming of a pre-manufactured device in order to change the configuration after the device is manufactured. One way to provide a variety of programming options is to use a technology that can be programmed multiple times, such as an electrically erasable programmable read only memory (EEPROM). Another possibility would be to use external pins to select an unused page in a programmable array. Yet another possibility would be to use special packaging which would allow the electrically programmable array to be erased and re-programmed. Such a technology may include ultraviolet (UV) erasure of an electrically programmable read only memory.

A disadvantage with any of these methods is the fact that they require relatively complex technology to implement a programmable structure that can be written to more than one time. The method of providing additional pins increases the entire pin count of the device, which reduces the desirability of the technology. The possibility of providing a special package that allows a one-time programmable structure to be erased is also more complex than a traditional plastic package.

Referring to FIG. 1, a circuit 10 is shown implementing an EEPROM as a programmable memory. The circuit 10 generally comprises a number of internal components, an EEPROM portion 12, one or more programming control inputs 14 and one or more outputs 16. The output 16 may be, in an example of a clock generator circuit, an output clock. The internal components, in the example of a clock generator circuit, may be a PLL 18, a PLL 20 and a miscellaneous logic block 22. The programming control received at the input 14 is presented to an input 24 of the EERPOM 12. The EEPROM 12 presents a signal to an input 28 of the miscellaneous logic block 22. The miscellaneous logic block 22 presents an output 30 that presents a signal to the output 16. Whatever function is implemented with the miscellaneous logic block 22, the EEPROM 12 presents control information in response to configuration information received from the external inputs 14. However, it would be desirable to replace the EEPROM 12 with a less complex one-time programmable technology without losing the ability to program the circuit 10 more than one time.

SUMMARY OF THE INVENTION

The present invention provides a method and architecture for allowing a device using a traditional one-time programmable technology to be programmed multiple times within the package. The present invention provides multiple programming without introducing the additional complexity of external pins or specialized packaging. An address counter and main array is provided using one-time programmable technology. The address counter selects a page in the main array to write the programmable information. The desired programming information is programmed into a first page while the additional pages remain unprogrammed. When additional information needs to be configured, the address counter is incremented and points to a new page in the main array where the new programming information may be stored. As a result, a number of programming configurations can be programmed into a one-time programmable technology. The advantages of erasable technology may be implemented using the simplicity of one-time programmable technology.

The object features and advantages of the present invention include providing a one-time programmable technology that may be programmed more than one time. The present invention does not incur the additional complexities of added external pins, special packaging or complex erasable technology.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
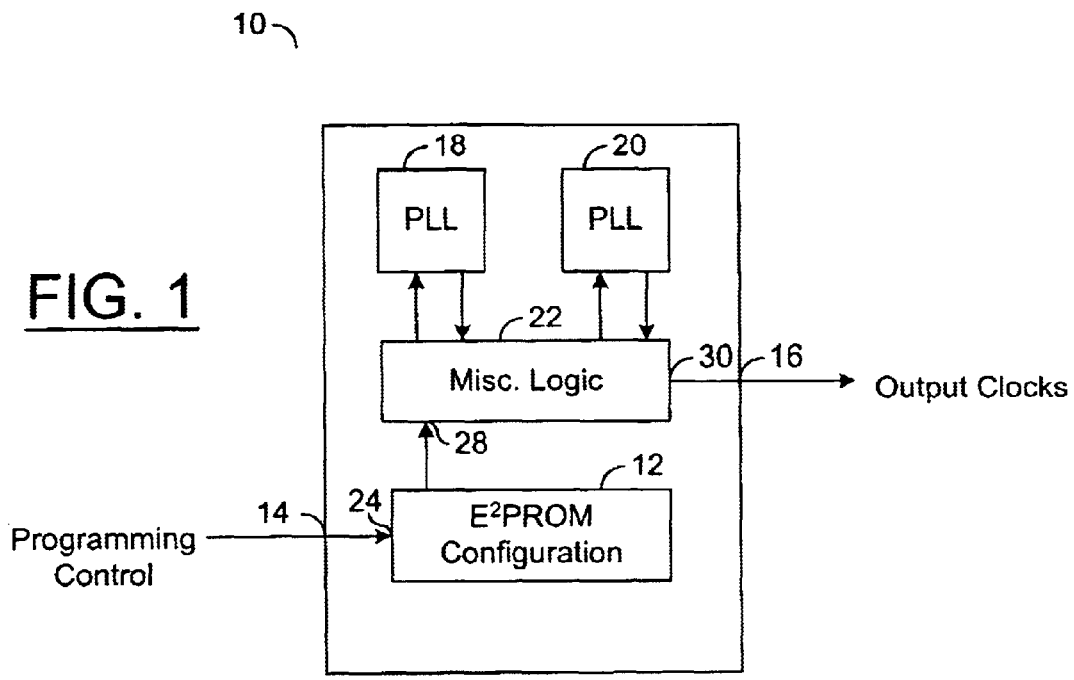
FIG. 1 is a block diagram of a previous approach to providing reprogrammable circuits.
Figure 2:
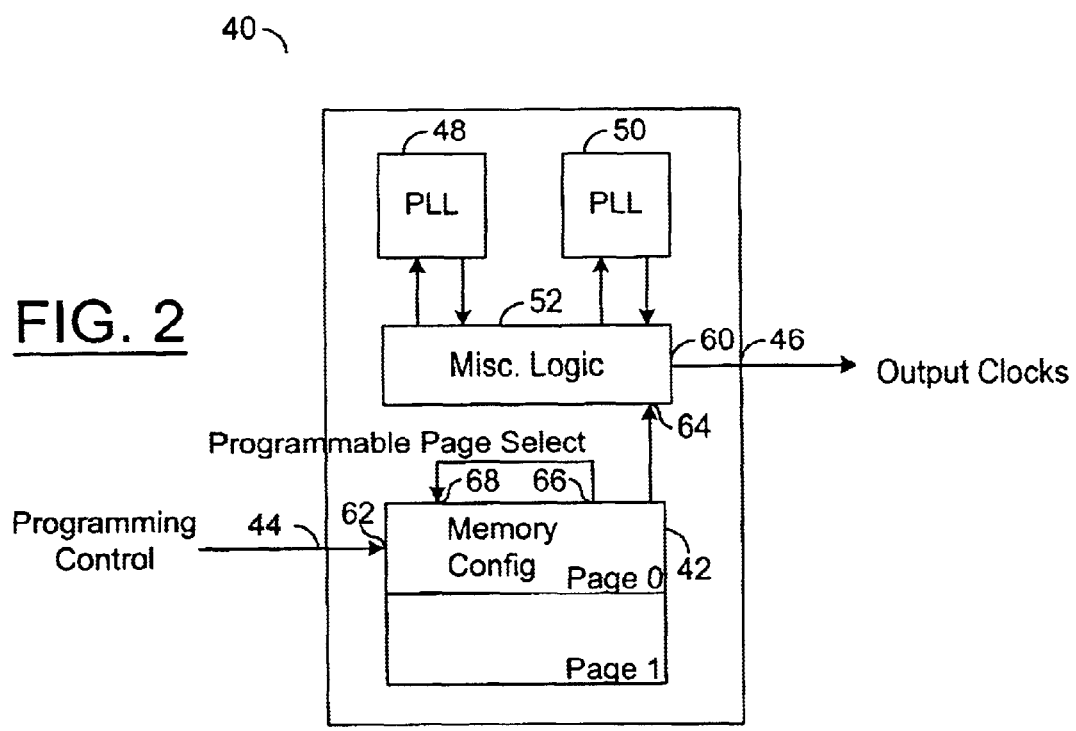
FIG. 2 is a block diagram of a preferred embodiment of the present invention.

Referring to FIG. 2, a block diagram of a circuit 40 is shown in accordance with a preferred embodiment of the present invention. The circuit 40 generally comprises a number of internal components, a memory portion 42, one or more programming control inputs 44 and an output 46. The circuit 40 may be used to perform a variety of operations. In one example, where the circuit 40 is used as a clock generator, the output 46 represents one or more clock outputs. The internal components, in the example of a clock generator circuit, may be a PLL 48, a PLL 50 and a miscellaneous logic block 52. The programming control received at the inputs 44 is generally presented to an input 62 of the memory 42. The memory 42 generally presents a signal to an input 64 of the miscellaneous logic 52. The miscellaneous logic 52 may present an output 60 that may present a signal to the output 46. Whatever function is implemented with the miscellaneous logic block 52, the memory 42 generally presents control information in response to information that may have been received from the external inputs 44.

The memory 42 generally has an output 66 that may present an incrementing signal that may be received at an incrementing input 68. Each time a new programming control signal is received at the input 62, the incrementing signal received from the output 66 presents a new value at the incrementing input 68. The incrementing signal may be implemented as an address counter or other means that provides a new address location each time the programming control signal changes. The new address location may be any non-repetitive counter. For example, a counter that increments to a new successive address each time a new programming control signal is presented at the input 44 may be the simplest type of counter. However, a non-sequential but non-repetitive counter may be useful. For example, a counter that selects an address location in the first page of the memory, then the third page of the memory, then the second page of the memory, then the fifth page of the memory, may be implemented to meet the design criteria of a particular application. Any non-repetitive counter may be used.

The memory 42 may be implemented using a variety of non-volatile technologies including but not limited to, an EPROM, an interconnect matrix, an anti-fuse, a fuse link, or other one-time programmable technology. In its simplest form, the memory 42 may be implemented as a two page, or 2-word, EPROM. A first page (or word) is used to program the circuit in the first instance. A second page (or word) is used to program the circuit in the second instance. With such a simplified two page configuration, the address counter may be implemented as a single-bit incrementing signal that switches between the first and second page between programming configurations. The incrementing signal received at the input 68 may be a feedback from the output 66.

In an implementation using a multi-page EPROM, one page may be used for testing the part, while the remaining pages may be used to provide the desired product configuration. Alternatively, each page may be used to implement separate standard program circuits. For example, the first page may be used to configure a clock generation circuit while the second page may be used to configure a buffer circuit. As a result, a manufacturer may reduce the inventory that is required to be stocked in any given time by using a standard generic part to produce a variety of products.

Figure 3:
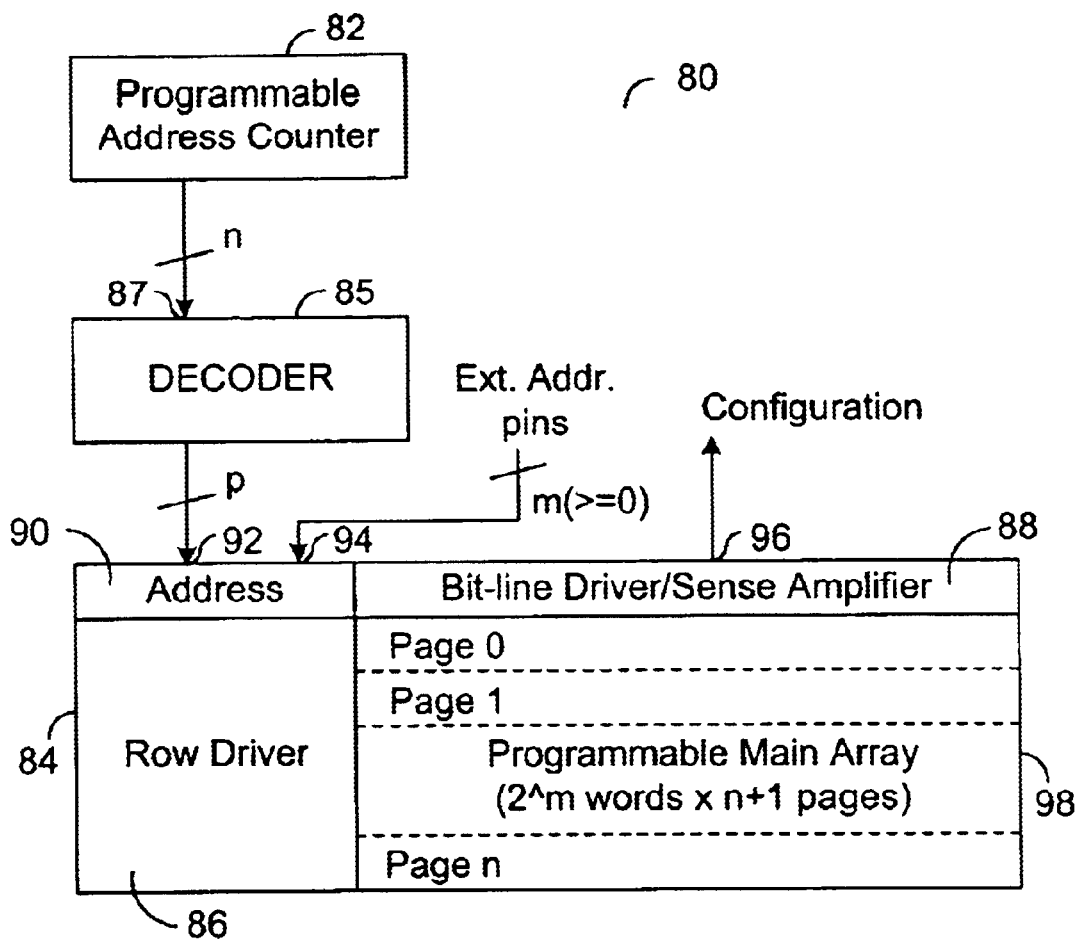
FIG. 3 is a block diagram of an alternate embodiment of the present invention implemented in a multi-page memory array.

Referring to FIG. 3, an alternate embodiment circuit 80 is shown. The circuit 80 generally comprises a programmable address counter 82, a memory 84 and a decoder 85. The memory 84 generally comprises a row driver 86, a bit-line driver/sense amplifier 88 and an address portion 90. The address portion 90 has an input 92 that receives a signal, through the decoder 85, from the programmable address counter 82. The address portion 90 also has an input 94 that receives a signal from one or more external address pins. The bit-line driver/sense amplifier 88 has one or more outputs 96 that present the configuration information that may be used to configure an external circuit, for example, the miscellaneous logic 52. The memory 84 also has a programmable main array 98 that comprises a plurality of individual pages, for example, page 0, page 1. . . page n. The number of pages in the array is equal to n+1 pages, where n is the number of the highest order page. Each of the pages may be configured, one at a time, to provide the desired configuration information at the output, 96. Each time a new configuration page is desired, the programmable address counter 82 may be programmed to increment the address 90 to write to a separate page of the programmable main array 98. The configuration information received at the output 96 may be used to either change minor controls, such as the output frequency of a clock generator, or to make major changes, such as changing between is a clock generator and an output buffer.

The number of pages implemented in the memory 84 may be controlled by the programmable address counter 82 and a decoder 85. The decoder 85 has an input 87 that may receive an n-bit signal from the programmable address counter 82. The decoder generally has an output that presents a p-bit signal to the input 92. For example, a single-bit signal at the input 92 may control a two page memory 84. A two-bit signal at the input 87 may control a three page memory. A three-bit signal (IP1, IP2 and IP3) at the input 87 may control a four page memory. In the example of a single-bit signal received at the input 94, a "0" may indicate the first page may be programmed and a "1" may indicate a second page to be programmed. The example of a two-bit signal (IP1 and IP2) received at the input 87 may control a three page memory 84. The following TABLE 1 illustrates the three independent states provided by a two-bit signal (i.e. IP1 and IP2 ):

TABLE 1

| IP1 | IP2 |
|---|---|
| 0 | 0 |
| 0 | 1 |
| 1 | 1 |

The following TABLE 2 illustrates the four independent states provided by a three-bit input received at the input signal (i.e., IP1, IP2 and IP3):

TABLE 2

| IP1 | IP2 | IP3 |
|---|---|---|
| 0 | 0 | 0 |
| 0 | 0 | 1 |
| 0 | 1 | 1 |
| 1 | 1 | 1 |

The configuration shown in TABLE 1 and TABLE 2 show each of the inputs IP1, IP2 and IP3 transitioning from a first state (i.e.,a "0") to a second state (i.e., a "1"). The states where the input would transition back from a "1" to "0" are not implemented due to the nature of the external address inputs. The decoder 85 essentially decodes the four states shown in TABLE 2 into a two-bit signal that may be presented at the input 92. In the example shown in TABLE 1, the three page implementation is converted back into a two-bit signal that is presented at the input 92.

An example of a practical application of the present invention may be shown in reference to an electrically programmable clock generator as shown in U.S. Pat. No. 5,684,434, which is hereby incorporated by reference in its entirety. In the cited reference, a programmable clock generator is programmed using a non-volatile programmable memory to store configuration information that is used to adjust the frequency of an output clock. The present invention may be used to expand the programmable memory and to allow reconfiguration of the clock generator after the initial configuration. In reference to the example shown in FIG. 2, the programming control input 44 receives information to configure the clock generator that is first stored in page 0 of the memory 42. The input 64 may be an input on the clock generator that is used to configure the output frequency of the clock generator. When an additional configuration is desired, the programming control 44 presents programming information that is stored in, for example, page 1 of the memory 42. As such, the desired reprogramming of the clock generator may be realized while maintaining the cost effective one-time programmable nature of the memory 42.

To implement the memory 42 as an interconnect matrix, an anti-fuse, a fuse link or other one-time programmable technology, the example of a multi-page EPROM may be extended. Specifically, different portions of the particular one-time programmable technology are generally configured as being independently programmable. A first portion of the technology may be used to store a particular configuration while a second portion of the technology may be used to store another particular configuration. In one example, a number of fuse links may be used to form a first programmable section of a fuse link matrix, while a second number of links may be used to create a second programmable portion of a fuse link matrix. As with the example described in FIG. 2, the particular one-time programmable technology may be implemented, in its simplest form, as a two page (or two portion) programmable technology.

While the invention has been particularly shown, and described with reference to preferred embodiments thereof, it will be understood by those skilled in the art that various changes in form and details may be made without departing from the spirit and scope of the invention.

What is claimed is:

1. A circuit comprising:

a first programmable memory comprising a plurality of one-time programmable pages where each page is independently programmable in response to a select signal; and a second programmable memory comprising a plurality of one-time programmable addresses, said second programmable memory configured to (i) store a value of said select signal and (ii) present said select signal in response to a programming signal, wherein said select signal is incremented to a new page in response to said programming signal independently of programming state of a current page, wherein said first programmable memory is configured to control the function of additional circuitry.

2. The circuit according to claim 1, wherein said programming signal is used to program said programmable memory.

3. The circuit according to claim 1, wherein:

two or more of said pages are programmable in response to said select signal; and said select signal is incremented two or more times each time said programming signal changes.

4. The circuit according to claim 1 wherein:

said first programmable memory comprises two independently programmable pages; and said select signal operates at a first state or a second state.

5. The circuit according to claim 1 wherein said first programmable memory comprises a technology selected from the group consisting of:

an EPROM, an interconnect matrix, an anti-fuse, a fuse link and other one-time programmable technology.

6. The circuit according to claim 1, further comprising a decoder configured to present addresses of said first programmable memory in response to values stored in said plurality of addresses of said second programmable memory, wherein the number of addresses presented by said decoder is greater than the number of addresses of said second programmable memory.

7. A method for reprogramming a conventionally non-reprogrammable memory comprising steps of:

programming a particular page of a multi-page one-time programmable memory in response to (i) a select signal and (ii) a programming signal;

storing data for said select signal in a programmable memory comprising a plurality of one-time programmable addresses; and incrementing said select signal to a new one-time programmable page location in response to said programming signal independently of a programming state of a current page, wherein said programmable memory is configured to control the function of additional circuitry.

8. The method according to claim 7 wherein said multi-page memory of said programming step is implemented in a one-time programmable technology.

9. The method according to claim 7 wherein said programming step comprises:

programming two or more pages; and incrementing said select signal two or more times.

10. The method according to claim 7 wherein:

said programmable memory comprises two independently programmable pages; and said select signal operates at a first state or a second state.

11. The method according to claim 7 wherein said multi-page memory comprises a technology selected from the group consisting of: an EPROM, an interconnect matrix, in anti-fuse, a fuse link and other one-time programmable technology.

12. The method according to claim 7, wherein the step of incrementing said select signal comprises programming one or more of said plurality of one-time programmable memory addresses.

13. The method according to claim 7, further comprising the step of:

generating said select signal in response to a decoded value of data contained in one or more of a plurality of one-time programmable addresses.

14. An apparatus comprising:

a programmable memory comprising a plurality of programmable pages, wherein said programmable pages are independently programmable in response to a select signal; and a circuit configured to present said select signal having a first state that enables a first one of said pages of said programmable memory and a second state that enables a second one of said pages of said programmable memory, wherein said select signal is stored among a plurality of one-time programmable addresses in said circuit and incremented between said first state and said second state in response to a programming signal independently of a programming state of a current page, wherein said programmable memory is configured to control function of additional circuitry.

15. The apparatus according to claim 14, wherein said first page of said programmable memory enables a testing mode of said circuit and said second page of said programmable memory enables a functional mode of said circuit.

16. The apparatus according to claim 14, wherein said select signal is incremented by programming one or more of said plurality of one-time programmable memory addresses.

17. The apparatus according to claim 14, wherein additional circuitry is configured in response to data stored in said programmable memory.

18. The apparatus according to claim 17, wherein said circuitry is reconfigured in response to incrementing said select signal and programming a page of said programmable memory selected by said incremented select signal.

* * * * *